United States Patent [19]

Rostoker et al.

[11] Patent Number: 5,644,152
[45] Date of Patent: Jul. 1, 1997

[54] CONDUCTIVE GERMANIUM/SILICON MEMBER WITH A ROUGHENED SURFACE THEREON SUITABLE FOR USE IN AN INTEGRATED CIRCUIT STRUCTURE

[75] Inventors: Michael D. Rostoker, San Jose; Ashok Kapoor, Palo Alto, both of Calif.

[73] Assignee: LSI Logic Corporation, Milpitas, Calif.

[21] Appl. No.: 462,653

[22] Filed: Jun. 5, 1995

Related U.S. Application Data

[62] Division of Ser. No. 121,679, Sep. 15, 1993, Pat. No. 5,521,108.

[51] Int. Cl.[6] .................. H01L 29/788; H01L 29/161; H01L 29/34
[52] U.S. Cl. .................. 257/317; 257/321; 257/616; 257/201; 257/192
[58] Field of Search .................. 257/317, 321, 257/616, 201, 192

[56] References Cited

U.S. PATENT DOCUMENTS

| | | | |
|---|---|---|---|
| 4,442,449 | 4/1984 | Lehrer et al. | 357/67 |
| 4,735,919 | 4/1988 | Faraone | 437/43 |
| 4,757,360 | 7/1988 | Faraone | 357/23.5 |
| 4,948,750 | 8/1990 | Kausche et al. | 437/101 |
| 4,957,777 | 9/1990 | Ilderem et al. | 427/55 |
| 5,017,505 | 5/1991 | Fujii et al. | 437/52 |
| 5,081,066 | 1/1992 | Kim | 437/200 |
| 5,087,583 | 2/1992 | Hazani | 437/43 |
| 5,110,752 | 5/1992 | Lu | 437/47 |
| 5,182,232 | 1/1993 | Chhabra et al. | 437/200 |
| 5,223,081 | 6/1993 | Doan | 156/628 |
| 5,238,855 | 8/1993 | Gill | 437/43 |
| 5,241,193 | 8/1993 | Pfiester et al. | 257/67 |
| 5,250,818 | 10/1993 | Saraswat | 257/616 |

FOREIGN PATENT DOCUMENTS 61-019147  1/1986  Japan .................. H01L 21/88

OTHER PUBLICATIONS

Selvakumer, et al, *IEEE Elec Dev Lett* vol. 12, No. 8 Aug. 1991 pp. 444–446 "SiGe . . . Implantation".

Liu, W.S., et al., "Instability of a $Ge_xSi_{1-x}O_2$ Film on a $Ge_xSi_{1-x}$ Layer", *Journal of Applied Physics*, vol. 72, No. 9, Nov. 1, 1992, pp. 4444–4446.

Wolf, Stanley, et al., Silicon Processing for the VLSI Era, vol. 1: *Process Technology*, Sunset Beach, California: Lattice Press, 1986, 303–308.

*Primary Examiner*—Jerome Jackson
*Attorney, Agent, or Firm*—John P. Taylor

[57] ABSTRACT

A conductive member is described with a surface of controlled roughness thereon which is useful in the construction of an integrated circuit structure. In a preferred embodiment, the conductive member is formed using a mixture of germanium and silicon which is then oxidized, resulting in the formation of a roughened surface on the germanium/silicon conductive member due to the difference in the respective rates of oxidation of the germanium and silicon. After oxidation of the conductive member, the oxide layer may be removed, leaving the toughened surface on the germanium/silicon conductive member. When an integrated circuit structure such as an EPROM is to be formed using this conductive member with a roughened surface, a further layer of oxide is then deposited over the roughened surface followed by deposition of a second layer of conductive material such as polysilicon or a germanium/silicon mixture, from which the control gate will be formed. A further oxide layer may then be formed over the second conductive layer followed by a patterning step to respectively form the floating gate (from the germanium/silicon layer) and the control gate from the second conductive layer.

14 Claims, 3 Drawing Sheets

- FORMING A LAYER OF GERMANIUM AND SILICON ON A SUBSTRATE
- GROWING A LAYER OF OXIDE ON THE SURFACE OF THE GERMANIUM/SILICON LAYER TO FORM A ROUGHENED SURFACE ON THE GERMANIUM/SILICON LAYER
- REMOVING THE OXIDE LAYER OVER THE GERMANIUM/SILICON LAYER 5,644,152

CONDUCTIVE GERMANIUM/SILICON MEMBER WITH A ROUGHENED SURFACE THEREON SUITABLE FOR USE IN AN INTEGRATED CIRCUIT STRUCTURE

This application is a division of application Ser. No. 08/121,679, filed Sep. 15, 1993, and now issued as U.S. Pat. No. 5,521,108, on May 28, 1996.

BACKGROUND OF THE INVENTION

1. Field of the Invention

This invention relates to integrated circuit structures formed on a semiconductor wafer. More particularly, this invention relates to an integrated circuit structure having an electrode with a roughened surface formed thereon, and a process for forming same.

2. Description of the Related Art

In the formation of integrated circuit structures on semiconductor wafers, it is sometimes desirable to provide, on a conductive element such as an electrode, a roughened surface. Such a roughened surface, for example, is useful on the surface of a floating gate facing the control gate in an erasable programmed read only memory (EPROM) device. Such a roughened surface, or asperities, formed on the floating gate of an EPROM device cause a more desirable controlled breakdown of the oxide between the floating gate and the control gate, known as Fowler-Norheim tunneling, rather than an avalanche breakdown through the oxide during discharge of the floating gate electrode.

However, such formation of a roughened surface of controlled texture, for example, on a metal or silicon surface, is not always easily accomplished on a reliably reproducible basis.

It would, therefore, be desirable to provide an integrated circuit structure having a conductive member, such as a floating gate in an EPROM, with a surface of controlled roughness thereon, and a process for forming same.

SUMMARY OF THE INVENTION

It is, therefore, an object of the invention to provide an integrated circuit structure having a conductive member with a surface of controlled roughness thereon.

It is another object of the invention to provide a process for forming an integrated circuit structure having a conductive member with a surface of controlled roughness thereon.

The invention comprises a conductive member with a surface of controlled roughness thereon which is useful in the construction of an integrated circuit structure. The conductive member is formed from a first conductive layer comprising a mixture of oxidizable conductive or semiconductive materials, such as a mixture of germanium and silicon, which is then oxidized, resulting in the formation of a roughened surface on the conductive layer due to the difference in the respective rates of oxidation of the materials such as germanium and silicon comprising the conductive layer. After oxidation of the conductive layer, the oxide layer may be removed, leaving the toughened surface on the conductive layer. When an integrated circuit structure such as an EPROM is to be formed using this conductive layer with a roughened surface, a further layer of oxide is then deposited over the roughened surface followed by deposition of a second layer of conductive material, e.g., such as polysilicon or a germanium/silicon mixture, from which the control gate will be formed.

A further oxide layer may then be formed over the second conductive layer followed by a patterning step to respectively form the floating gate having a roughened surface thereon (from the first conductive layer) and the control gate from the second conductive layer.

DETAILED DESCRIPTION OF THE INVENTION

The invention comprises an integrated circuit structure with a conductive member having a roughened surface formed thereon and a process for making same. Such an integrated circuit structure having a roughened surface conductive member, and the formation of same, will be described below with respect to the formation of an EPROM device, by way of illustration and not of limitation.

The term "roughened surface", as used herein, is defined as a surface having localized regions where electric fields would be increased by more than 10% above the average electric field, as measured in other portions of the same surface, i.e., a surface in which the electric fields are not homogeneous throughout the surface.

Figure 1:
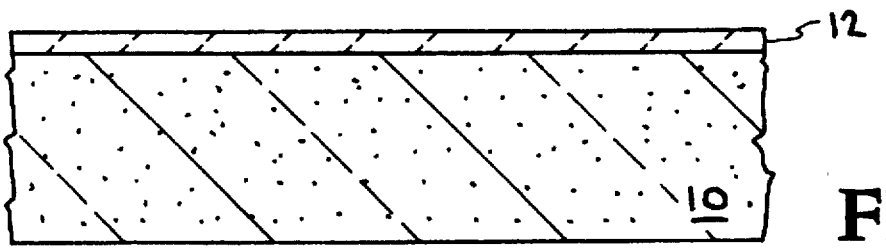
FIGS. 1–8 are fragmentary vertical cross-sectional views which sequentially show the construction of an integrated circuit structure having a floating electrode comprising, as an example, a germanium/silicon material with a roughened upper surface thereon facing an upper control electrode.

Turning now to FIG. 1, a semiconductor substrate, which may comprise a silicon wafer, is shown at 10, having a silicon oxide gate oxide layer 12 formed thereover, as the initial step in forming an integrated circuit structure incorporating therein the conductive member having a roughened surface thereon of the invention.

Figure 2:
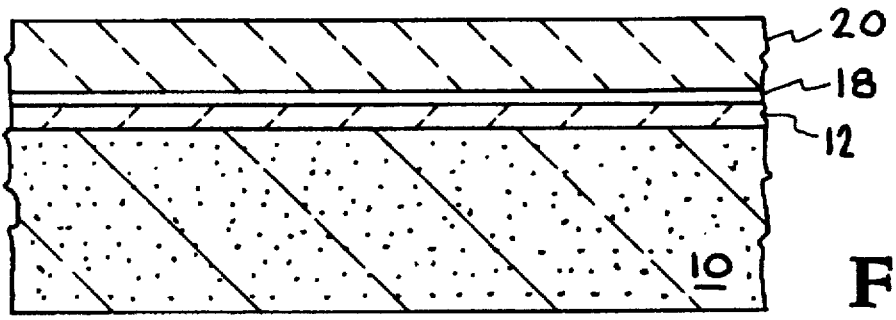

In accordance with the invention, as shown in FIG. 2, a thin layer of silicon 18, having a thickness of from about 200 Angstroms to about 500 Angstroms, is optionally deposited over oxide layer 12 as a seeding layer for further deposition. Next a conductive layer 20 is then formed over oxide layer 12. Conductive layer 20 may comprise a mixture of any two conductive and/or semiconductive materials capable of reacting to thereby form a roughened surface thereon.

In one embodiment, conductive layer 20 comprises a mixture of two or more conductive and/or semiconductive materials capable of oxidizing at different rates to form the desired toughened surface thereon. Such materials may include, for example, silicon, germanium, and/or carbon. For purposes of illustration, and not by way of limitation, conductive layer 20 will hereinafter be described as a mixture of germanium and silicon.

Preferably, germanium/silicon layer 20 is formed over gate oxide layer 12 by a CVD process whereby one or more silicon-containing gases and one or more germanium-containing gases are flowed into a vacuum deposition chamber to deposit on a wafer therein. However, any other process capable of producing a layer of controlled germanium/silicon ratio may be used to form germanium/silicon layer 20. Examples of gases which may be used in a CVD process to deposit silicon include silane ($SiH_4$), disilane ($Si_2H_6$), and dichlorosilane ($SiCl_2H_2$). Germane ($GeH_4$) is an example of a gas which may be used in a CVD process to deposit germanium. The ratio of germanium to silicon to be deposited may be controlled by controlling the ratio of silicon-containing gas to germanium-containing gas being flowed into the vacuum deposition chamber. Generally the ratio of germanium to silicon in the deposited layer should vary from about 1 wt. % to about 70 wt. % germanium, and preferably from about 10 wt. % to about 50 wt. % germanium, with the balance comprising silicon.

The germanium/silicon layer, when deposited by a CVD process, may be deposited at a pressure ranging from about 10 milliTorr to about 1 Torr, and while maintaining a deposition temperature within a range of from about 300° C. to about 700° C.

The silicon-containing gas and the germanium-containing gas may be flowed into the deposition chamber together with a non-reactive carrier gas such as, for example, nitrogen, argon, or helium. The amounts of the respective gases flowed into the deposition chamber, using as an example, a 10 liter deposition chamber, may range from about 10 to about 5000 standard cubic centimeters/minute (sccm) of germanium-containing gas, from about 10 to about 500 sccm of silicon-containing gas, and from about 0 to about 2000 sccm of one or more carder gases, to achieve the desired ratio of germanium to silicon in the deposited layer.

The thickness of the germanium/silicon layer will be dependent on the flow rates of the incoming gases, the temperature, pressure, and time of deposition. Preferably, the thickness of the deposited germanium/silicon layer will vary from about 1000 Angstroms to about 6000 Angstroms, and most preferably from about 2000 Angstroms to about 4000 Angstroms, with a typical thickness being about 3000 Angstroms.

The conductivity of the germanium/silicon layer may be increased either by adding one or more doping agents, e.g., boron, phosphorous, or arsenic, to the mixture of germanium and silicon as it is formed, or by implanting the germanium/silicon layer, after formation, with one or more doping agents such as boron, phosphorous, or arsenic. Subsequent annealing to activate the dopant may be carried out at the same time as the control gate electrode is annealed (if an EPROM device is being constructed) as will be discussed below. The amount of dopant which should be added to the germanium/silicon layer to render it sufficiently conductive for use as a conductive electrode in an integrated circuit structure will vary from about $10^{19}$ atoms/cm$^3$ to about $10^{21}$ atoms/cm$^3$.

Figure 3:
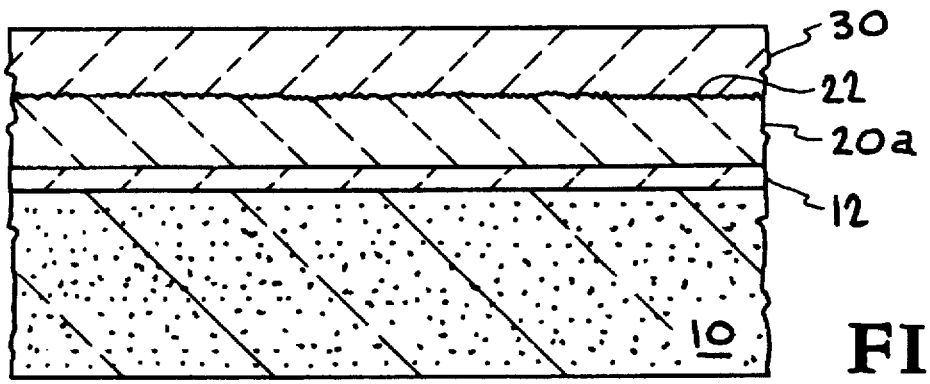

After formation of germanium/silicon layer 20 over gate oxide layer 12, a layer of oxide 30 is grown over/in germanium/silicon layer 20, as shown in FIG. 3. Oxide layer 30 comprises a mixture of germanium oxide and silicon oxide. As shown in FIG. 3, the difference in oxidation rates of the germanium and the silicon in germanium/silicon layer 20 results in an irregular or roughened surface 22 on remaining germanium/silicon layer 20a, in accordance with the invention. The amount of such roughening of surface 22 may be adjusted by adjusting the amount of germanium present in original germanium/silicon layer 20 (the germanium/silicon layer prior to the oxidation step).

To provide a sufficient amount of oxidation and resultant surface roughening, at least about 1000 Angstroms of oxide 30 should be grown over/in original germanium/silicon layer 20. Greater amounts of oxide, i.e., greater than 1000 Angstroms, can be grown, but are not deemed to be necessary to achieve the desired roughened surface 22. In fact excessive oxide growth is undesirable since the total thickness of the remaining germanium/silicon layer 20a may be undesirably reduced.

Figure 4:
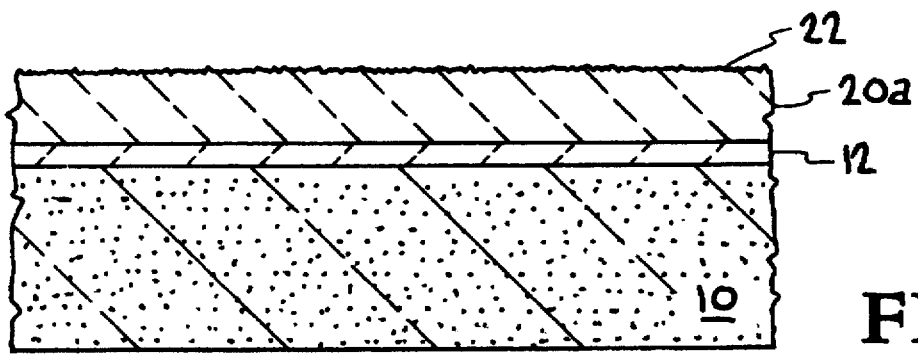

After the step of growing oxide layer 30 to achieve the desired roughened germanium/silicon surface 22 in remaining germanium/silicon layer 22a, oxide layer 30 may be removed by any selective wet or dry oxide removal process such as, for example, using dilute HF or a rinse in water followed by plasma etching of the SiO$_2$, i.e., oxide layer 30, using CHF$_3$, resulting in the structure shown in FIG. 4.

Figure 5:
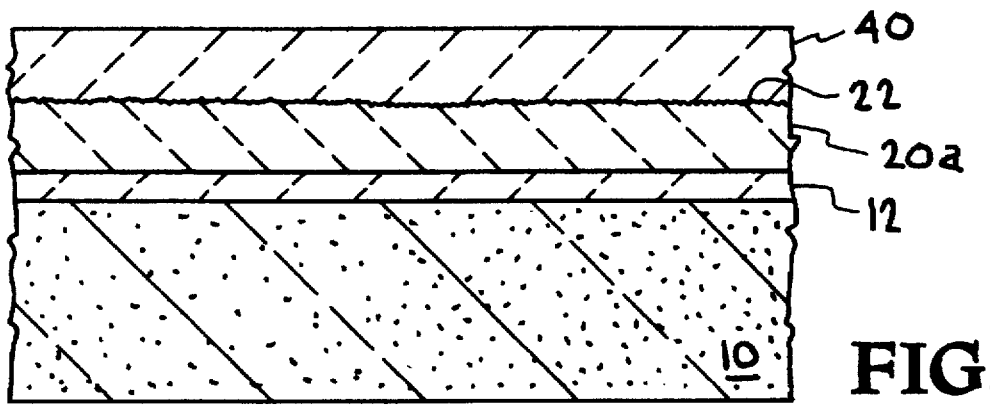

After removal of grown oxide layer 30, a further oxide layer 40 may be deposited, for example by a CVD process, to a thickness ranging from about 200 Angstroms to about 2000 Angstroms, as shown in FIG. 5. Any conventional oxide deposition process may be used to deposit oxide layer 40 over "germanium/silicon" layer 20a.

Figure 6:
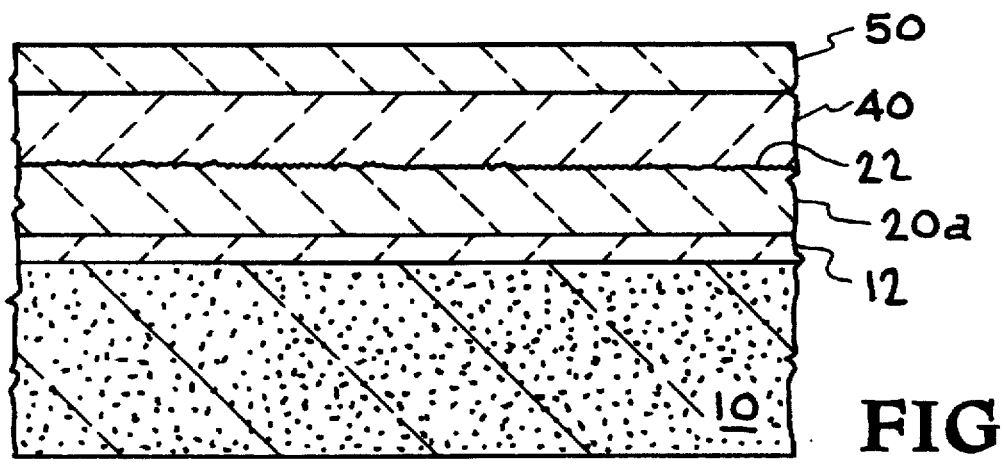

After formation of deposited oxide layer 40 over germanium/silicon layer 20a having roughened surface 22 thereon, a further conductive layer 50 may be formed over oxide layer 40, as shown in FIG. 6. Layer 50 may be used, for example, to form the control gate of an EPROM device. Conductive layer 50 could comprise a polysilicon layer, but preferably will comprise a mixture of germanium and silicon. Such a germanium/silicon mixture is preferable to a silicon layer to permit annealing of previously doped layer 20a and layer 50 (after implantation with a dopant) at a lower temperature rather than annealing at a temperature of about 950° C., which would be necessary for activation of an implanted silicon layer. This higher annealing temperature, i.e., 950° C., is deemed to be an unsatisfactorily high temperature for further processing of the structure. This is due to the presence of germanium/silicon layer 20a previously formed thereon, and particularly in view of the previously formed roughened surface 22 thereon. Such a high annealing temperature could result in some flow of underlying germanium/silicon layer 20a, resulting in an undesirable smoothing of previously formed roughened surface 22 thereon.

Thus, when layer 50 is formed of a germanium/silicon mixture, both layer 20a and layer 50 may be annealed or activated at the same time at a lower temperature of from about 500° C. to about 600° C. for a period of from about 30 minutes to about an hour without damage to the previously formed roughened surface 22 on layer 20a.

It should be noted, however, that a higher annealing temperature, e.g., from about 900° C. to about 950° C., can be used in connection with a rapid thermal anneal (RTA) process, since the high temperature in such an anneal is only maintained for a period of from about 30 seconds to about 2 minutes. In such a case, either a doped germanium/silicon layer or a doped polysilicon layer may be used as second conductive layer 50.

Germanium/silicon layer 50 may be formed using the previously described process for CVD formation of germanium/silicon layer 20 from a mixture of one or more germanium-containing gases and one or more silicon-containing gases. Germanium/silicon layer 50 is deposited to a thickness which may range from about 1000 Angstroms to about 6000 Angstroms, preferably from about 2000 Angstroms to about 4000 Angstroms, and typically about 3000 Angstroms.

Figure 7:
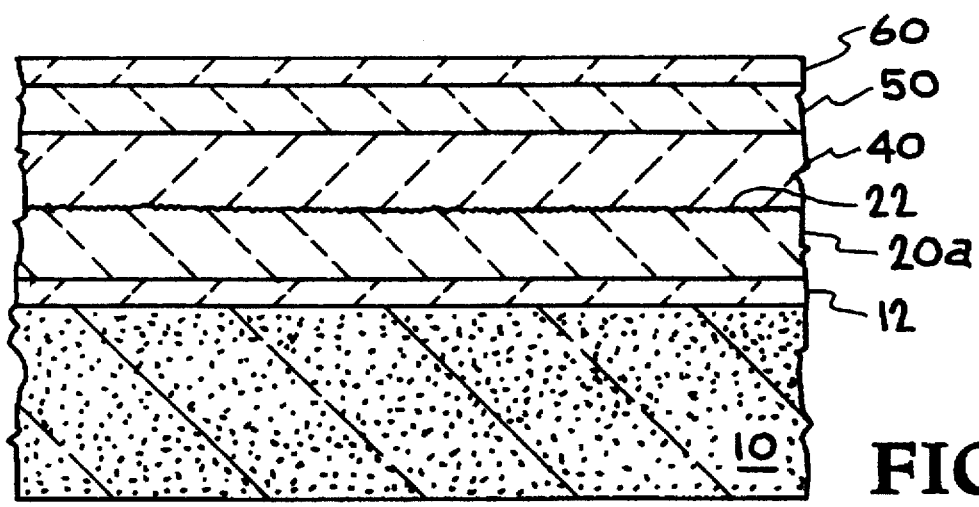

After formation of germanium/silicon layer 50 over the structure, a further protective layer 60 may be deposited by any suitable process over germanium/silicon layer 50, as shown in FIG. 7. Protective layer 60 may comprise at least about 200 Angstroms of a protective layer of oxide or nitride to protect the structure prior to further processing.

Figures 8, 9:
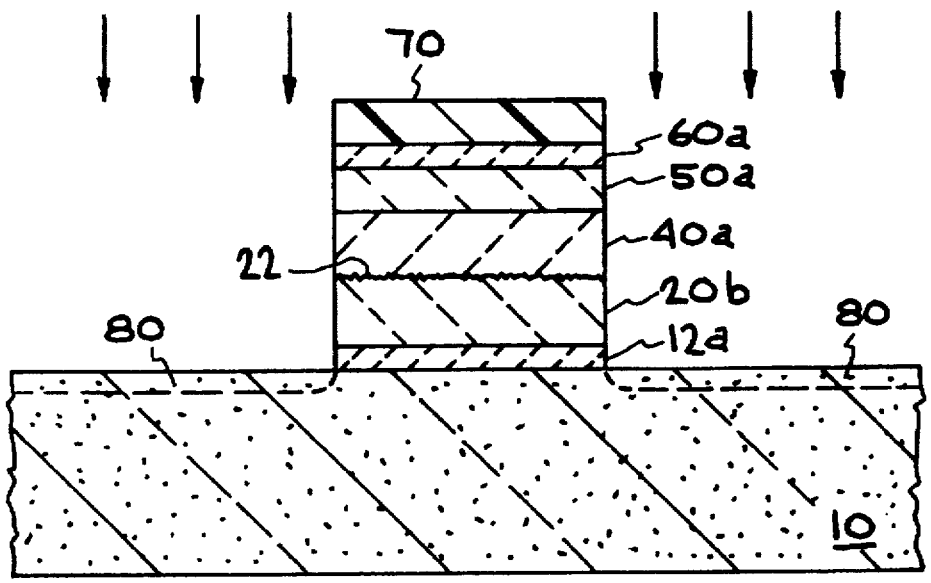
FIG. 9 is a flow sheet illustrating the process of the invention.

Subsequently, as shown in FIG. 8, the structure may be patterned, using a photoresist mask 70, to remove selected portions of layers 12, 20a, 40, 50, and 60, thereby exposing substrate 10. These exposed potions of substrate 10 may then be conventionally implanted, as shown in FIG. 8, e.g., with arsenic or phosphorus, to form source and drain regions 80 in substrate 10 adjacent gate oxide portion 12a, floating electrode 20b, oxide portion 40a, control electrode 50a, and oxide portion 60a which remain after the patterning step. For devices with small channel lengths, lightly doped drains (LDD) may be formed.

Thus, the invention provides a conductive member with a surface of controlled roughness thereon which is useful in the construction of an integrated circuit structure, such as, for example, an EPROM device. The conductive member can be formed using a mixture of germanium and silicon which is then oxidized, resulting in the formation of a roughened surface on the germanium/silicon conductive member due to the difference in the respective rates of oxidation of the germanium and silicon.

Having thus described the invention what is claimed is:

1. An EPROM integrated circuit structure including a floating gate electrode comprising a mixture of germanium and silicon and provided with a roughened surface thereon which comprises:
   a) a silicon semiconductor substrate;
   b) a silicon oxide gate layer formed over said substrate;
   c) a first conductive layer of silicon and germanium formed over said silicon oxide gate layer and patterned to form said floating gate electrode, said first conductive layer of silicon and germanium having a roughened, surface thereon formed by oxidizing the surface of said layer of silicon and germanium layer and then removing said oxidized silicon and germanium;
   d) a deposited layer of oxide formed over said roughened surface of said first conductive layer of silicon and germanium; and
   e) a second conductive layer formed over said deposited layer of oxide and patterned to form a control gate electrode, said control gate electrode having a surface facing said roughened surface of said floating gate electrode.

2. The conductive layer of silicon and germanium of claim 1 wherein said mixture comprises from about 1 wt. % to about 70 wt. % germanium, with the balance comprising silicon.

3. The conductive layer of silicon and germanium of claim 2 wherein said mixture comprises from about 10 wt. % to about 50 wt. % germanium, with the balance comprising silicon.

4. The conductive layer of silicon and germanium of claim 1 wherein said conductive layer of silicon and germanium has a roughened surface having localized regions wherein electric fields are increased by at least 10% more than the average electric field, as measured in other portions of said surface.

5. The conductive member of claim 1 wherein said roughened surface is formed on said conductive layer of silicon and germanium by oxidizing said conductive layer of silicon and germanium.

6. The conductive layer of silicon and germanium of claim 1 wherein said layer of silicon and germanium has a thickness ranging from about 1000 Angstroms to about 6000 Angstroms.

7. The conductive layer of silicon and germanium of claim 1 wherein said layer of silicon and germanium has a thickness ranging from about 2000 Angstroms to about 4000 Angstroms.

8. An integrated circuit structure comprising:
   a) a first oxide layer formed on a semiconductor substrate;
   b) a first conductive layer of germanium and silicon formed over said first oxide layer;
   c) a roughened surface formed on said conductive layer of germanium and silicon by growing a layer of mixed oxides of germanium and silicon over said germanium and silicon conductive layer, which grown layer of mixed oxides is then removed;
   d) a second oxide layer deposited over said roughened surface on said conductive layer of germanium and silicon; and
   e) a second conductive layer formed over said second oxide layer.

9. The integrated circuit structure of claim 8 wherein said first conductive layer of germanium and silicon comprises from about 1 wt. % to about 70 wt. % germanium, with the balance comprising silicon.

10. The integrated circuit structure of claim 8 wherein said first conductive layer of germanium and silicon comprises from about 10 wt. % to about 50 wt. % germanium, with the balance comprising silicon.

11. The integrated circuit structure of claim 8 wherein said first conductive layer has a surface having localized regions where electric fields are increased by more than 10% above the average electric field, as measured in other portions of the same surface.

12. The integrated circuit structure of claim 8 wherein said first conductive layer of germanium and silicon has a thickness ranging from about 1000 Angstroms to about 6000 Angstroms.

13. The integrated circuit structure of claim 8 wherein said first conductive layer of germanium and silicon has a thickness ranging from about 2000 Angstroms to about 4000 Angstroms.

14. An integrated circuit structure comprising:
   a) a first oxide layer on a semiconductor substrate;
   b) a first conductive layer of germanium and silicon formed over said first oxide layer;
   c) a roughened surface on said first conductive layer of germanium and silicon formed by growing a layer of silicon oxide and germanium oxide on a surface of said germanium and silicon conductive layer, which silicon oxide and germanium oxide is then removed;
   d) a second oxide layer deposited over said roughened surface on said conductive layer of germanium and silicon; and
   e) a second conductive layer formed over said second oxide layer.

* * * * *

UNITED STATES PATENT AND TRADEMARK OFFICE
CERTIFICATE OF CORRECTION

PATENT NO. : 5,644,152
DATED : July 1, 1997
INVENTOR(S) : Michael D. Rostoker and Ashok Kapoor It is certified that error appears in the above-indentified patent and that said Letters Patent is hereby corrected as shown below:

Title Page:

Item [57], Abstract, line 10, change "toughened" to "roughened".

Col. 5, line 26, Claim 1, after roughened, delete ",".

Col. 5, line 27, Claim 1, after "germanium", delete "layer".

Signed and Sealed this

Seventh Day of October, 1997

*Attest:*

BRUCE LEHMAN

*Attesting Officer*      *Commissioner of Patents and Trademarks*